US006851914B2

(12) United States Patent
Hirata (10) Patent No.: US 6,851,914 B2
(45) Date of Patent: Feb. 8, 2005

(54) COMPONENT-PLACING APPARATUS (75) Inventor: Atsuhiko Hirata, Yasu-gun (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/628,523

(22) Filed: Jul. 28, 2003

(65) Prior Publication Data

US 2004/0042890 A1 Mar. 4, 2004

(30) Foreign Application Priority Data

Aug. 29, 2002 (JP) ........................................ 2002-250110

(51) Int. Cl.⁷ .............................................. H05K 13/04
(52) U.S. Cl. ........................ 414/627; 29/740; 294/64.1; 414/752.1
(58) Field of Search ............................. 414/752.1, 737, 414/627; 29/740; 294/64.1

(56) References Cited

U.S. PATENT DOCUMENTS 5,446,323 A * 8/1995 Neff et al. ..................... 310/12
6,211,591 B1 * 4/2001 Kowalski et al. ............. 310/80

FOREIGN PATENT DOCUMENTS

| JP | 5-82998 | | 4/1993 |
| JP | 8-203966 | | 8/1996 |
| JP | 927698 | * | 1/1997 |
| WO | 02/26011 | * | 3/2004 |

* cited by examiner

Primary Examiner—Janice L. Krizek
(74) Attorney, Agent, or Firm—Ostrolenk, Faber, Gerb & Soffen, LLP (57) ABSTRACT

A component-placing apparatus for driving a nozzle in the rotational and vertical directions for applying suction to a component includes a rotary actuator and a linear actuator having a stator connected to a stator of the rotary actuator such that these stators are immovable relative to each other. A spline shaft is connected to a rotating shaft of the rotary actuator, and a nozzle connecting shaft having a suction nozzle disposed at the bottom thereof is engaged with the spline shaft and is allowed to move only rectilinearly. A hollow holder encircling the nozzle connecting shaft with rotary bearings being interposed therebetween is connected to a mover of the linear actuator, and the hollow holder is engaged with the stator of the linear actuator with a linear guide being interposed therebetween.

22 Claims, 5 Drawing Sheets

COMPONENT-PLACING APPARATUS

BACKGROUND OF THE INVENTION

1. Field of the Invention

The present invention relates to a component-placing apparatus having a suction head for mounting an electronic component on a board or the like, or for assembling electronic components.

2. Description of the Related Art

Hitherto, a component-placing apparatus having a suction head has been used for mounting an electronic component such as a semiconductor chip and/or a piezoelectric component on a board such as a printed circuit board.

As an example of such a component-placing apparatus, as disclosed in Japanese Unexamined Patent Application Publication No. 5-82998, a nozzle head has been proposed in which a rotary motor for rotating a nozzle for applying suction to an electronic component and a cylindrical linear motor for vertically moving the nozzle, are disposed coaxially with the nozzle, such that moving parts of these motors rotate or move vertically while being integral with the nozzle.

Also, as disclosed in Japanese Unexamined Patent Application Publication No. 8-203966, a semiconductor-mounting apparatus has been proposed in which a suction nozzle, a pressure shaft which is movable vertically and rotatable and has the suction nozzle at the bottom thereof, an ultrasonic motor for turning the pressure shaft, and a voice coil motor for moving the pressure shaft in the vertical direction are disposed such that the pressure shaft extends through the voice coil motor and the ultrasonic motor.

In the former proposal, when the voice coil motor is used as the cylindrical linear motor, since the shaft extends through the center of the voice coil motor, the central part of the motor cannot be used as a core; hence, the voice coil motor does not effectively generate a thrust force. Accordingly, the size of the voice coil motor must unavoidably be large. Also, the rotary motor is rotated together with a yoke and a casing of the voice coil motor, thereby causing problems of large inertia and large size of the rotary motor. In addition, when a moving coil of the voice coil motor rotates together with the shaft, feeding the moving coil with current is difficult.

In the latter proposal, since the hollow pressure shaft extends through the center of the voice coil motor, the central part of the motor cannot be used as a core; hence the voice coil motor does not effectively generate a thrust force, thereby requiring the voice coil motor to be large. In addition, since a moving coil of the voice coil motor rotates together with the shaft, feeding the moving coil with current is difficult.

SUMMARY OF THE INVENTION

Accordingly, the present invention provides a component-placing apparatus which includes a linear actuator and a rotary actuator and which are small in size which precisely positions a component at high speed in the direction of the Z-axis and about the θ-axis.

In order to achieve the above-mentioned advantages, a component-placing apparatus according to the present invention for driving a suction nozzle in the rotational and vertical directions for applying suction to a component includes a rotary actuator; a linear actuator including a stator connected to a stator of the rotary actuator such that these stators are immovable relative to each other; a spline shaft connected to a rotating shaft of the rotary actuator; a nozzle connecting shaft allowed to move only rectilinearly in the longitudinal direction of the spline shaft relative to the spline shaft and having the suction nozzle disposed at the bottom thereof; a hollow holder encircling the nozzle connecting shaft with rotary bearings being interposed therebetween which allow the nozzle connecting shaft to rotate with respect to the spline shaft and connected to a mover of the linear actuator; and a linear guide for guiding the hollow holder relative to either of the stators of the actuators so as to be rectilinearly movable parallel to the spline shaft.

A functional equivalent may be substituted for the spline shaft.

The rotation of the rotary actuator is transmitted to the nozzle connecting shaft through the spline shaft. The nozzle connecting shaft having the suction nozzle disposed at its bottom is rectilinearly movable relative to the spline shaft. The hollow holder rotatably holding the nozzle connecting shaft is connected to the mover of the linear actuator. With this structure, when the holder is vertically moved by driving the linear actuator, the nozzle connecting shaft moves vertically together with the holder. In this state, since the nozzle connecting shaft and the spline shaft are movable in the axial direction, the rotational movement of the spline shaft can be transmitted to the nozzle connecting shaft regardless of the position at which the nozzle connecting shaft lies. Accordingly, the nozzle connecting shaft, and resultantly the suction nozzle, can be vertically moved to a desired position and turned-to a desired orientation.

As described above, since the vertical movement generated by the linear actuator and the rotational movement generated by the rotary actuator are transmitted to the suction nozzle through the mechanism using the spline shaft, the rotary bearings, and the linear guide, the stators of the linear actuator and the rotary actuator can be mutually fixed and thus are not required to drive each other. Accordingly, the mass of the vertically driven part and the inertia of the rotating part of the component-placing apparatus can be reduced, and thus a required thrust force of each actuator can be reduced, whereby both the rotary actuator and the linear actuator can be downsized.

Also, since the actuators directly drive the nozzle both in the Z-axis direction and about the θ-axis without an indirect transmission mechanism being interposed therebetween, a component can be precisely placed at high speed. Further, although the suction nozzle is radially shifted relative to the axis of the linear actuator, the nozzle is prevented from tilting due to its own weight, since the hollow holder is guided by the linear guide, thereby achieving a precise pick-and-place operation.

In addition, since no shafts extend through the centers of the linear actuator and the rotary actuator, for example, a commercially available, compact servomotor can be used as the rotary actuator. Also, the central part of the linear actuator can be used as a core, whereby the linear actuator can effectively generate a thrust force. As a result, when a voice coil motor is used as the linear actuator, the size of a magnetic circuit of the voice coil motor can be reduced. In this case, since the moving coil of the voice coil motor moves only reciprocally and is not required to rotate, the moving coil can be easily fed with current.

In the component-placing apparatus according to the present invention, the stators of the rotary actuator and the linear actuator are preferably fixed to a moving head of a drive mechanism driven in the X- and Y-directions.

When the stator of each actuator is fixed to the moving head, the component-placing apparatus can be independently driven in the X- and Y-directions by the drive mechanism, about the θ-axis by the rotary actuator, and in the Z-direction by the linear actuator, respectively. Thus, a component can be precisely placed.

Also, in the component-placing apparatus according to the present invention, it is preferable that the mover and the stator of the linear actuator have a return spring disposed therebetween for urging the mover upwards with its spring force which is slightly greater than the sum of the weight load of a moving part of the apparatus including the mover, the suction nozzle, and the nozzle connecting shaft, and a sliding frictional force generated between the linear guide and the spline shaft.

When the suction nozzle is vertically moved by driving the linear actuator, the suction nozzle drops when current to the linear actuator is shut off, due to the weight of the moving part including the suction nozzle. The return spring prevents this dropping. However, when the return spring produces a large spring force, the linear actuator consumes a large amount of power in order to move the suction nozzle down. To solve the above problem, by setting the spring force of the return spring so as to be slightly greater than the sum of the weight load of the moving part and the sliding frictional force generated between the linear guide and the spline shaft, the suction nozzle can be moved down with a small amount of power consumption.

Furthermore, in the component-placing apparatus according to the present invention, it is preferable that the hollow holder and the nozzle connecting shaft have an effectively sealed, or preferably a hermetically sealed, airtight chamber formed in a cylindrical space therebetween; that the nozzle connecting shaft have an air passage formed therein for transmitting a pressure medium such as air in the airtight chamber to the suction nozzle; that an air port in communication with the airtight chamber be formed in the outer surface of the hollow holder, and that the air port be connected to a vacuum suction apparatus.

In order to produce a suction pressure at a suction opening of the suction nozzle, the vacuum suction apparatus and the suction nozzle are required to be connected. Although the vacuum suction apparatus can be directly connected to the suction nozzle with an air hose being interposed therebetween, since the suction nozzle moves vertically and rotationally, there is a possibility that the hose is twisted or causes an operational resistance against the suction nozzle.

With this problem in mind, when the air hose for vacuum suction is connected to the air port formed in the outer surface of the hollow holder and the air port is connected to the suction nozzle with the airtight chamber and the air passage of the nozzle connecting shaft being interposed therebetween, the hose moves only vertically together with the hollow holder and does not rotate; accordingly, the hose is unlikely to be twisted and does not prevent the operation of the suction nozzle.

Other features and advantages of the present invention will become apparent from the following description of embodiments of the invention which refers to the accompanying drawings.

DESCRIPTION OF EMBODIMENTS OF THE INVENTION

FIGS. 1 to 4 show a component-placing head (i.e., a component-placing apparatus) according to an embodiment of the present invention. Here, an electronic component P and a board B are referred to as a component and a fixing surface, respectively.

A component-placing head A according to the embodiment includes a supporting plate 1 fixed to a head of an X-Y robot or the like, a voice coil motor 2 as an example of a linear actuator having a stator (yoke) 3 fixed on the under surface of the supporting plate 1, and a servomotor 20 as an example of a rotary actuator having a stator 21 fixed on the upper surface of the supporting plate 1.

Figure 2:
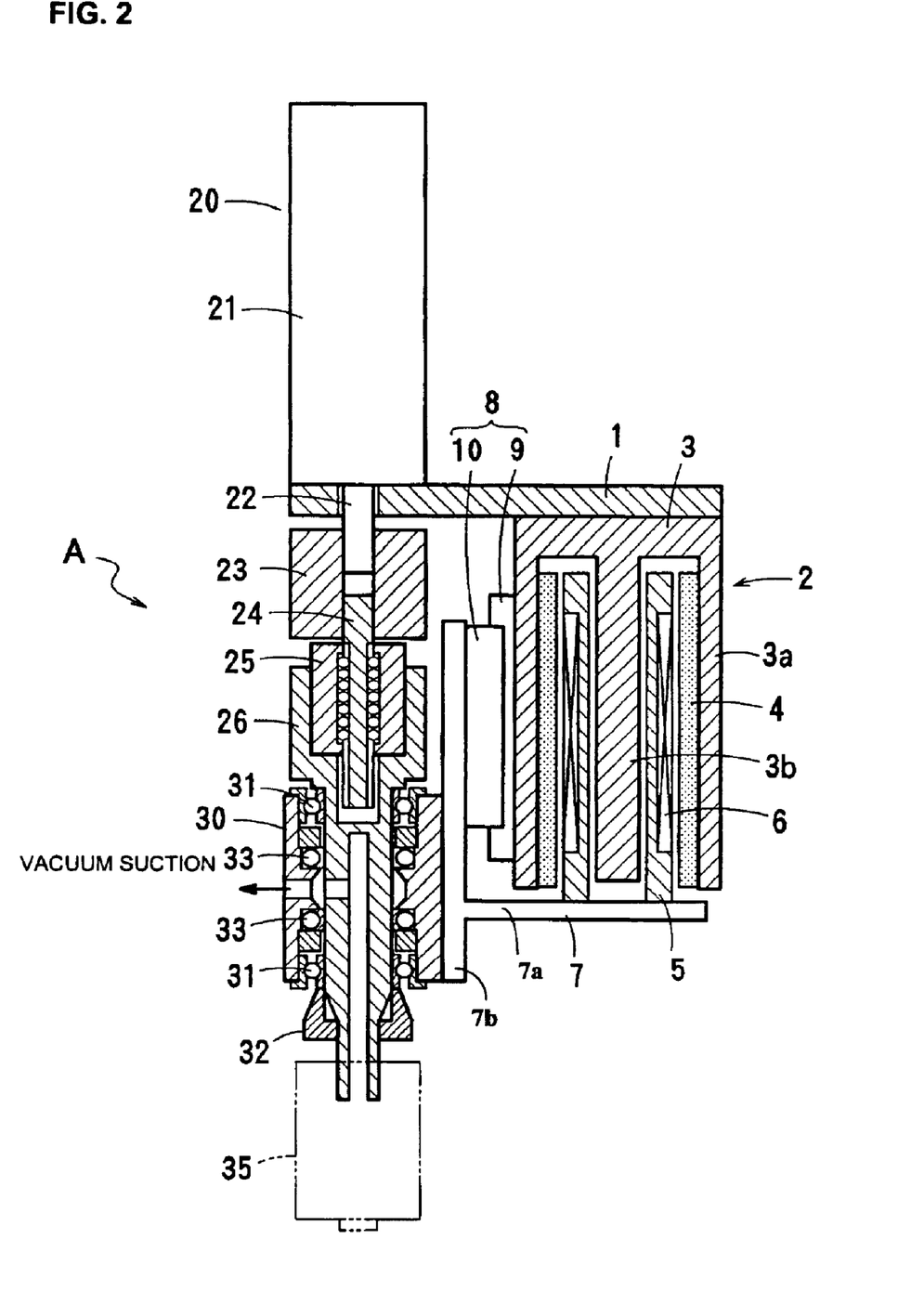
FIG. 2 is a sectional view of the component-placing apparatus shown in FIG. 1.

As shown in FIG. 2, the voice coil motor 2 is fixed on the lower surface of the supporting plate 1 and formed by the yoke 3 having an outer yoke 3a and a center yoke 3b, a magnet 4 fixed on the inner surface of the outer yoke 3a, a bobbin 5 inserted in the yoke 3 so as to be vertically movable, a coil 6 wound around the bobbin 5, and so forth. The coil 6 lies overlapping with the magnet 4 in the axial direction. In this embodiment, the magnet 4 and the coil 6 are respectively disposed on the stationary and moving sides; on the other hand, the coil 6 and the magnet 4 may be respectively disposed on the stationary and moving sides.

The bobbin 5 has a horizontal portion 7a of an approximately L-shaped connecting member 7 fixed on the bottom surface thereof, and a vertical portion 7b of the connecting member 7 protrudes axially parallel to the yoke 3, having a guide block 10 fixed on one side surface thereof. The guide block 10 is guided by a guide rail 9 fixed on the outer surface of the yoke 3 so as to be movable only in the vertical direction so that the guide rail 9 and the guide block 10 constitute a linear guide 8. The connecting member 7 has a hollow holder 30, which will be described later, fixed on the other side surface of the vertical portion 7b. Thus, the hollow holder 30 performs a precise and smooth linear motion relative to the yoke 3.

Figure 1:
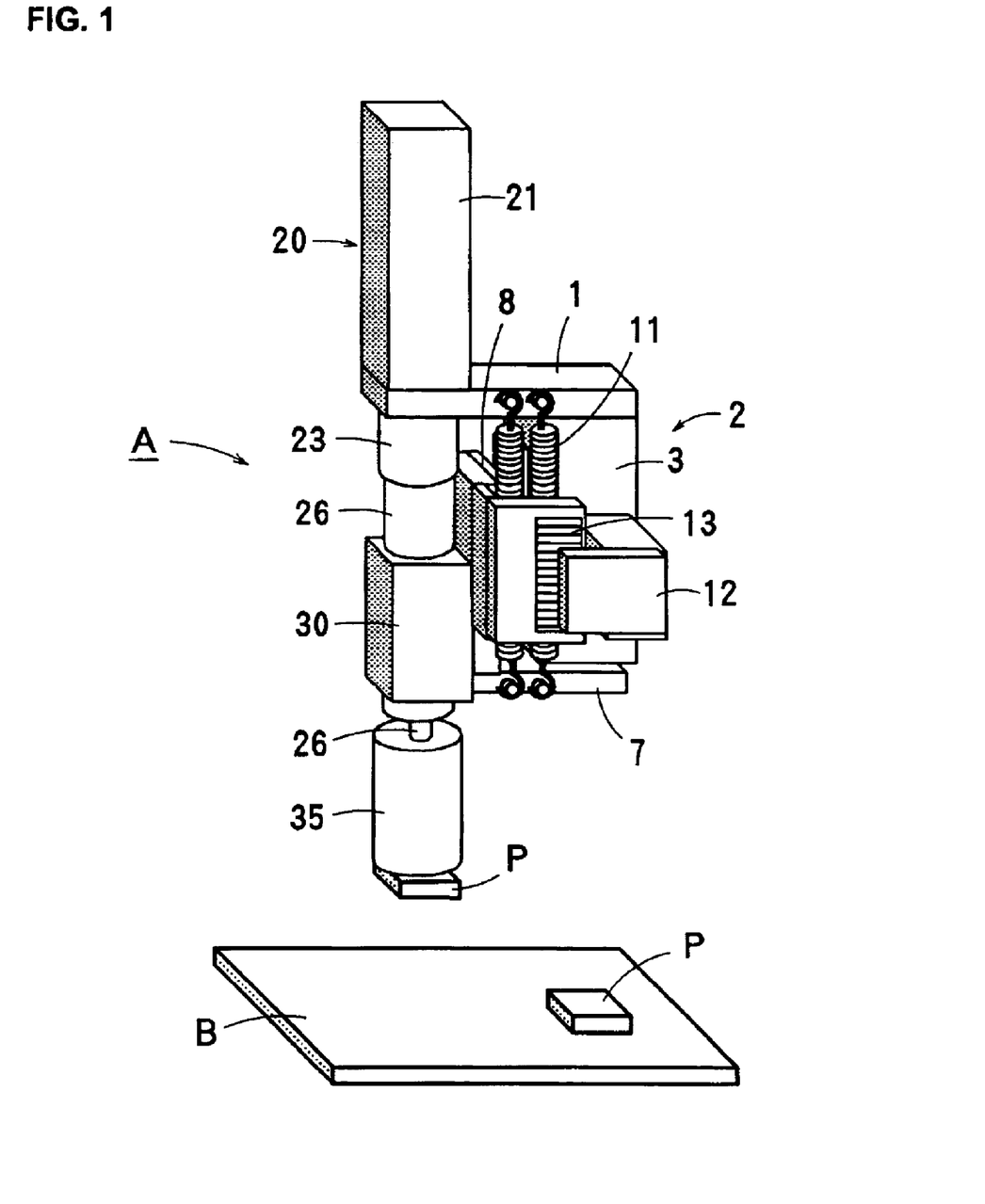
FIG. 1 is a perspective view of an example of a component-placing apparatus according to an embodiment of the present invention.

As shown in FIG. 1, the connecting member 7 and the supporting plate 1 have a return spring 11 interposed therebetween which is designed so as to return the bobbin 5 acting as a mover of the voice coil motor 2 to its top position when the power is off. The tensile force of the return spring 11 is set slightly greater than the sum of the weight load of a moving part including the bobbin 5, the coil 6, a suction nozzle 35, and a nozzle connecting shaft 26, which will be both described later, and a sliding frictional force generated between the linear guide 8 and a ball spline shaft 24, which will be described later. The return spring 11 is not limited to a tensile spring and may be a compression spring. In order to detect the vertical movement of the voice coil motor 2, the yoke 3 has a linear encoder 12 fixed thereon, and the connecting member 7 has a linear scale 13 fixed thereon. By feeding back a signal of the linear encoder 12, the suction nozzle 35 can be controlled so as to lie at a desired vertical position.

The servomotor 20 has an encoder integrated therein and can control the component-placing head so as to lie at a desired rotational position by feeding back a signal of the encoder. The servomotor 20 has a rotating shaft 22 extending downwards with the supporting plate 1 being interposed therebetween, and the rotating shaft 22 has the ball spline shaft 24 connected thereto with a coupling 23 being interposed therebetween. The ball spline shaft 24 is combined with a ball spline nut 25, to which the top of the nozzle connecting shaft 26 is fixed. Thus, although the nozzle connecting shaft 26 rotates integrally with the ball spline shaft 24, it can move freely in the axial direction relative to the ball spline shaft 24 since its vertical movement is set free between the ball spline shaft 24 and the ball spline nut 25. In addition, the yoke 3 may have a stopper (not shown) on the surface thereof for limiting the moving range of the guide block 10 so as to prevent the ball spline nut 25 from being pulled out from the ball spline shaft 24.

The nozzle connecting shaft 26 extends through the hollow holder 30, and the hollow holder 30 and the nozzle connecting shaft 26 are connected to each other at the upper and lower portions thereof by bearings (rotary bearings) 31 with flanges. Thus, the nozzle connecting shaft 26 is rotatable relative to the holder 30 but is vertically immovable relative to the same. When the voice coil motor 2 is activated, the holder 30 and the nozzle connecting shaft 26 move vertically in one united body. Since the lower bearing 31 is fixed by a nut 32 screwed together with a screw formed at the lower portion of the nozzle connecting shaft 26, the play in the vertical direction between the nozzle connecting shaft 26 and the holder 30 is minimized.

Figure 3:
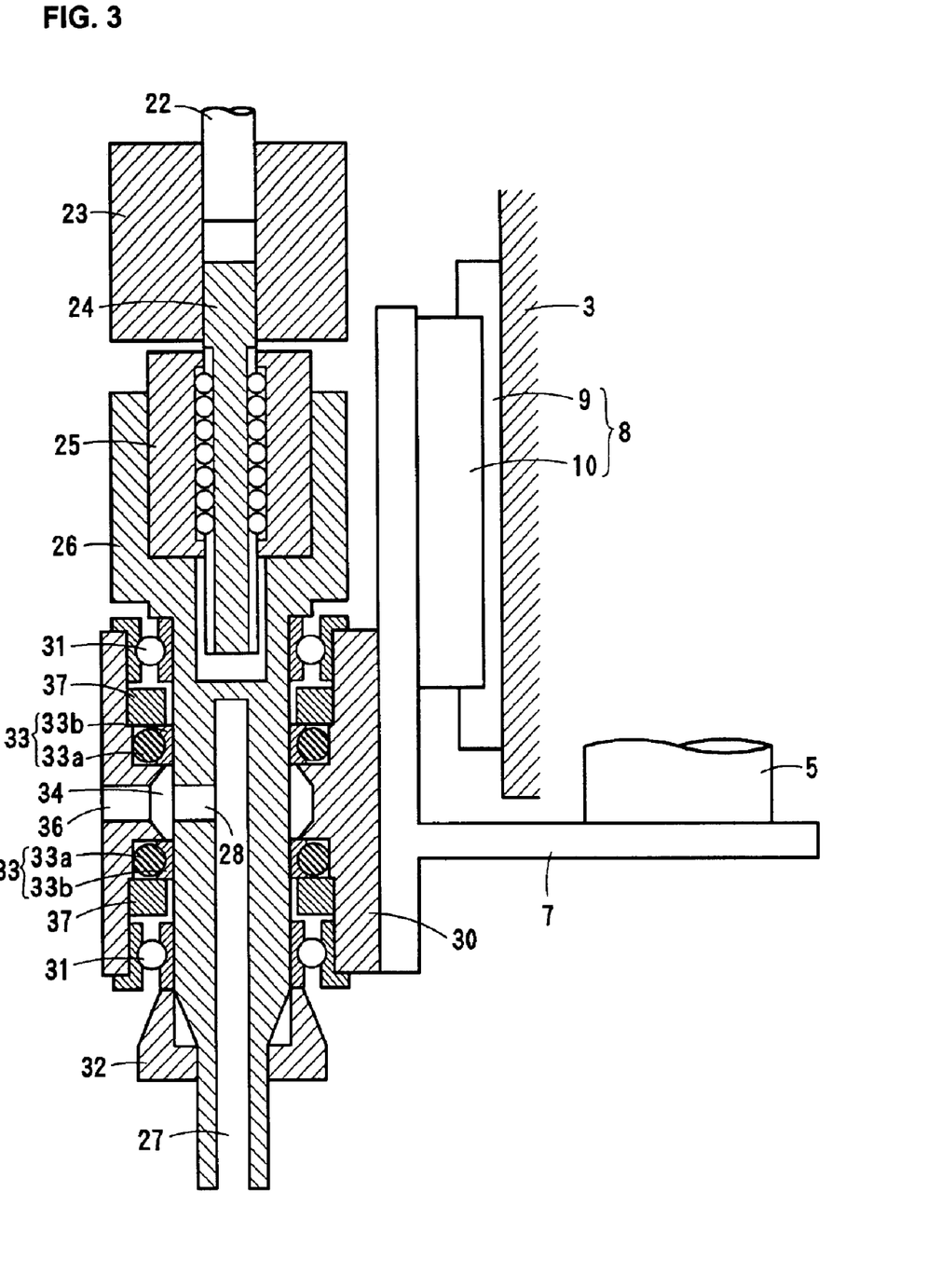
FIG. 3 is a magnified view of a major part of the component-placing apparatus shown in FIG. 2.

Referring now to FIG. 3, in an approximately cylindrical space formed by the nozzle connecting shaft 26 and the hollow holder 30, two seals 33 are disposed between the two bearings 31 so as to provide an airtight chamber 34 therebetween, thereby preventing air from flowing into and out from the chamber 34 in the vertical direction. The seals 33 in this embodiment are each a combination seal of a rubber ring 33a such as an O-ring and a resin ring 33b composed of a tetrafluoroethylene resin and disposed on the inner periphery of the rubber ring 33a. Also, two seal stoppers 37 are provided. Although a known oil seal or an O-ring could be used as each of the seals 33, they have problems in that they are difficult to reduce in size and have a short life span because of a large sliding friction. As opposed to these components, with the above-combination seals, when the nozzle connecting shaft 26 rotates, since a slip occurs between the resin rings 33b and the nozzle connecting shaft 26 and does not occur between the rubber rings 33a and the holder 30, the nozzle connecting shaft 26 can rotate with a very small sliding resistance.

The nozzle connecting shaft 26 has a hollow structure so as to provide an air passage 27 therein having an open bottom. Also, the nozzle connecting shaft 26 has an air hole 28 formed therein for communication between the internal air passage 27 and the external airtight chamber 34. The nozzle connecting shaft 26 has the suction nozzle 35 fixed at the bottom thereof. The suction nozzle 35 has a shock-absorbing mechanism (not shown) with a spring built therein so as to absorb a shock against the electronic component P at the time of applying suction to it and mounting it on the board B. The hollow holder 30 has an air port 36 formed in the outer surface thereof for communication to the airtight chamber 34, to which an air hose (not shown) is connected. The air hose is connected to a vacuum suction apparatus (not shown). Thus, a suction pressure is transmitted to the suction nozzle 35 through the air port 36, the airtight chamber 34, the air hole 28, and the air passage 27.

An operation of the component-placing head A having the above-mentioned structure will be described with reference to FIGS. 3 and 4.

FIG. 3 illustrates a state in which the voice coil motor 2 is switched off and the moving part including the suction nozzle 35 is raised to its top position (original position) by the spring force of the return spring 11.

Figure 4:
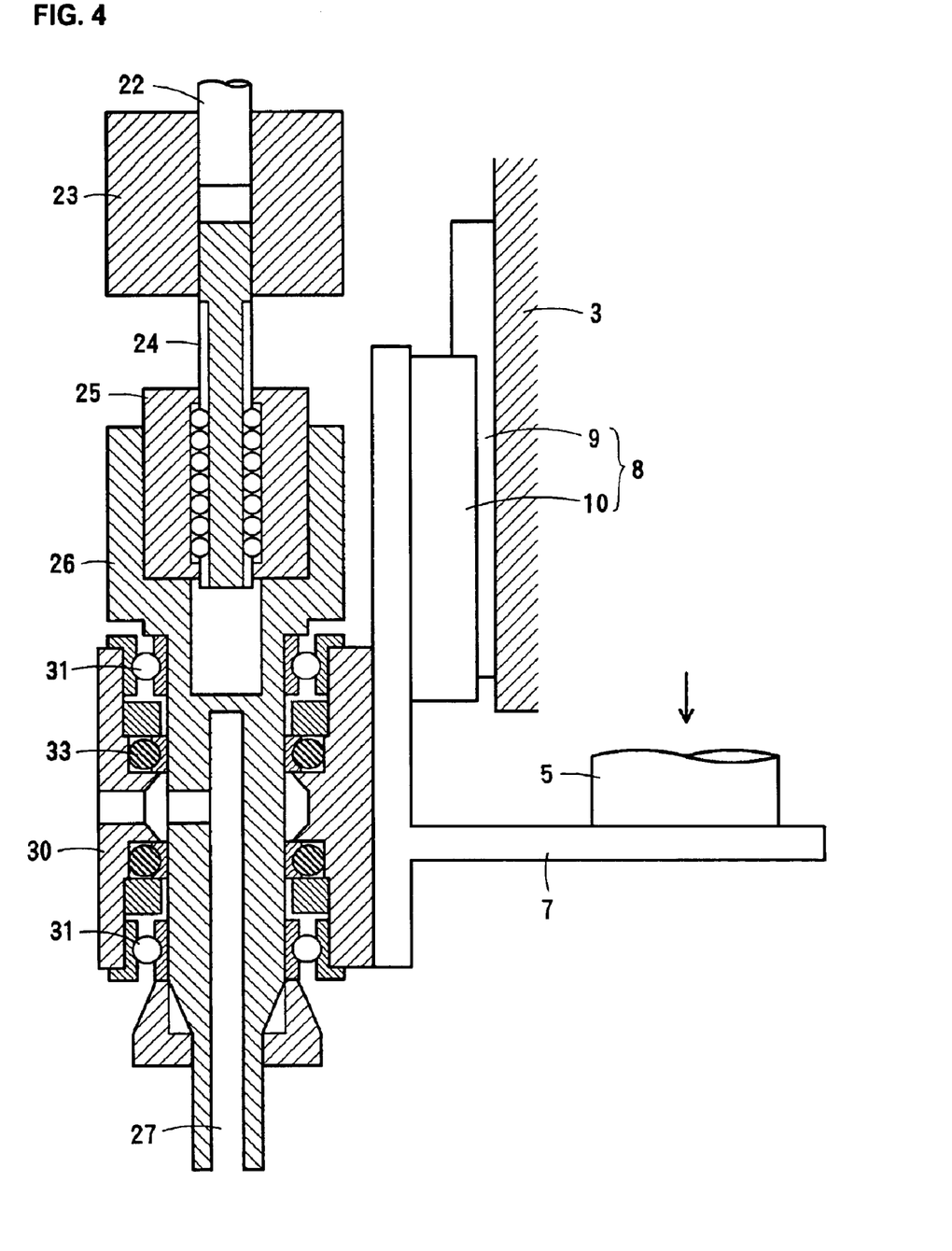
FIG. 4 is a sectional view showing the major part of the apparatus of FIG. 2 in operation.

Then, by feeding current to the coil 6 of the voice coil motor 2 in a predetermined direction, the coil 6 receives a thrust force in the axial direction in proportion to the product of a magnetic density, an amount of current, and a conductor length of the coil; hence, as shown in FIG. 4, the holder 30 connected to the coil 6 with the connecting member 7 being interposed therebetween also moves downwards (i.e., downwards in the Z-axis direction as indicated by the arrow shown in FIG. 4). Since the nozzle connecting shaft 26 is held to the holder 30 with the bearings 31 being interposed therebetween so as to be rotatable but immovable in the axial direction, the nozzle connecting shaft 26 can move downwards while maintaining the ball spline shaft 24 and the ball spline nut 25 in engagement with each other. As a result, the suction nozzle 35 fixed to the bottom of the nozzle connecting shaft 26 moves downwards so as to mount the electronic component P held by suction at the end thereof on the board B.

For adjusting the orientation of the electronic component P around the θ-axis (i.e., the rotating axis of the component-placing head A) in order to mount the electronic component P on the board B, the servomotor 20 is driven so as to turn the electronic component P to a proper orientation. In this state, since the rotation of the servomotor 20 is transmitted to the nozzle connecting shaft 26 through the ball spline shaft 24 and the ball spline nut 25, and the bearings 31 prevent the rotating force of the servomotor 20 from being transmitted to the holder 30, the nozzle connecting shaft 26 can be rotated with a small torque. As a result, the orientation of the electronic component P can be precisely adjusted.

Even when the nozzle connecting shaft 26 is moved in the vertical and rotating directions as described above, since the air port 36 is formed so as to lie in the holder 30, the position of the air port 36 varies only vertically, and hence the air hose is unlikely to be twisted or bent, thereby causing no load on the suction nozzle 35 at all. In addition, since a passage extending from the air port 36 of the holder 30 to the air passage 27 formed in the nozzle connecting shaft 26 has an invariable channel area even when the nozzle connecting shaft 26 rotates, the air pressure in the passage does not drop, thereby allowing the suction nozzle 35 to produce a stable suction force.

As described above, the component-placing head A has the servomotor 20, the nozzle connecting shaft 26, and the suction nozzle 35, all disposed coaxially with each other, and directly transmits the torque of the servomotor 20 to the suction nozzle 35. Thus, the servomotor 20 can be made small in size and also the positioning of the electronic component P around the θ-axis can be precisely performed.

Also, the voice coil motor 2 vertically drives only the nozzle connecting shaft 26 and the holder 30 and is not required to vertically drive the servomotor 20 and the ball spline shaft 24. As a result, the voice coil motor 2 is only required to produce a relatively small thrust force and hence can be made small in size. Although the axis of the voice coil motor 2 is radially shifted relative to the axis of the nozzle connecting shaft 26 and the suction nozzle 35, the suction nozzle 35 is not likely to be tilted, since the holder 30 holding the nozzle connecting shaft 26 is guided to move only in the vertical direction by the linear guide 8, thereby achieving a precise pick-and-place operation of the component-placing head A.

Figure 5:
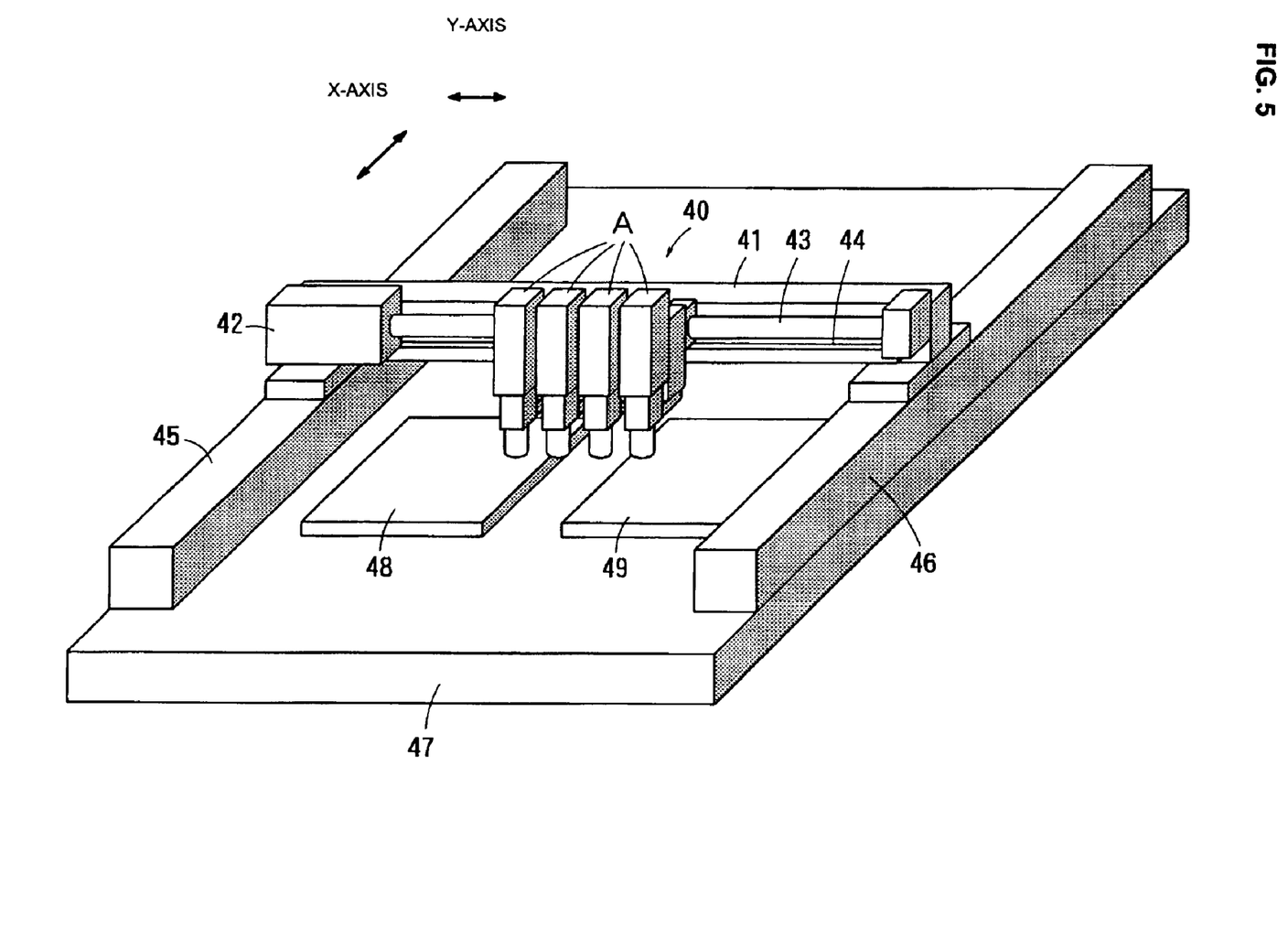
FIG. 5 is a perspective view of a mounting apparatus using the component-placing apparatus shown in FIG. 1.

FIG. 5 illustrates an example of a mounting apparatus using the above-described component-placing head A.

This mounting apparatus has a multi-head 40 formed by four units of the component-placing heads A. The multi-head 40 is supported by a Y-axis beam 41, which includes a servomotor 42, a ball screw 43, and a linear guide 44, both ends of which are supported by two linear motors 45 and 46 driven in the X-axis direction. The Y-axis beam 41 and the linear motors 45 and 46 are subjected to a feedback control using a linear scale and a linear encoder (both not shown) so that the multi-head 40 is positioned at a desired position on an X-Y plane lying perpendicular to the Z-axis.

The linear motors 45 and 46 are supported by a mounting table 47, on which a feeding board 48 and a placing board 49 are arranged. With this structure, each nozzle of the component-placing heads A can be independently controlled in the direction of the Z-axis and about the θ-axis in concert with the movements of the Y-axis beam 41 and the linear motors 45 and 46 along the X- and Y-axes. Thus, an electronic component can be precisely transferred from the feeding board 48 to the placing board 49.

Although a voice coil motor 2 is used as the linear actuator by way of example in the above-described embodiment, a combination of a servomotor, a ball screw, and a linear guide, or an air cylinder, may be used in place of the voice coil motor, for example. In the former case, the linear guide of the linear actuator can be also used as a linear guide for guiding the hollow holder so as to be rectilinearly movable parallel to the spline shaft.

Although the present invention has been described in relation to particular embodiments thereof, many other variations and modifications and other uses will become apparent to those skilled in the art. Therefore, the present invention is not limited by the specific disclosure herein.

What is claimed is:

1. A component-placing apparatus for driving a suction nozzle in the rotational (θ) and vertical (Z) directions for applying suction to a component, comprising:
   a rotary actuator;
   a linear actuator comprising a stator connected to a stator of the rotary actuator such that these stators are immovable relative to each other;
   a spline shaft connected to a rotating shaft of the rotary actuator;
   a nozzle connecting shaft connected to the spline shaft for being allowed to move only rectilinearly in the longitudinal direction of the spline shaft relative to the spline shaft and having the suction nozzle disposed at the bottom thereof;
   a hollow holder encircling the nozzle connecting shaft with rotary bearings being interposed therebetween which allow the nozzle connecting shaft to rotate with respect to the spline shaft and connected for being driven by a mover of the linear actuator; and
   a linear guide for guiding the hollow holder relative to the stators of the actuators so as to be rectilinearly movable parallel to the spline shaft;
   wherein the mover and the stator of the linear actuator have a return spring disposed therebetween for urging the mover upwards, the return spring having a spring force which is slightly greater than the sum of the weight load of a moving part of the apparatus including the mover, the suction nozzle, and the nozzle connecting shaft, and a sliding frictional force generated between the linear guide and the spline shaft.

2. The component-placing apparatus according to claim 1, wherein said linear actuator is a voice-coil motor.

3. The component-placing apparatus according to claim 1, wherein said return spring is a tension spring.

4. A component-placing apparatus for driving a suction nozzle in the rotational (θ) and vertical (Z) directions for applying suction to a component, comprising:
   a rotary actuator;
   a linear actuator comprising a stator connected to a stator of the rotary actuator such that these stators are immovable relative to each other;
   a spline shaft connected to a rotating shaft of the rotary actuator;
   a nozzle connecting shaft connected to the spline shaft for being allowed to move only rectilinearly in the longitudinal direction of the spline shaft relative to the spline shaft and having the suction nozzle disposed at the bottom thereof;
   a hollow holder encircling the nozzle connecting shaft with rotary bearings being interposed therebetween which allow the nozzle connecting shaft to rotate with respect to the spline shaft and connected for being driven by a mover of the linear actuator; and
   a linear guide for guiding the hollow holder relative to the stators of the actuators so as to be rectilinearly movable parallel to the spline shaft;
   wherein the hollow holder and the nozzle connecting shaft have a sealed chamber formed in a space therebetween;
   the nozzle connecting shaft has an air passage formed therein for transmitting a pressure medium to the chamber from the suction nozzle;
   an air port in communication with the chamber is formed in the outer surface of the hollow holder, and
   the air port is connectable to a vacuum suction apparatus for causing said transmission of said pressure medium.

5. The component-placing apparatus according to claim 4, wherein said sealed chamber is defined between a pair of seals disposed between said hollow holder and said nozzle connecting shaft.

6. The component-placing apparatus according to claim 5, wherein said pair of seals are both disposed between said rotary bearings.

7. The component-placing apparatus according to claim 5, further comprising a respective pair of seal stoppers arranged for holding said pair of seals in place in said hollow holder.

8. The component-placing apparatus according to claim 5, wherein each said seal comprises a low-friction sealing ring which engages said nozzle connecting shaft.

9. The component-placing apparatus according to claim 8, wherein said low-friction sealing ring is a resin ring.

10. The component-placing apparatus according to claim 8, wherein each said seal further comprises a compressible sealing ring disposed between said low-friction sealing ring and said hollow holder.

11. The component-placing apparatus according to claim 10, wherein said low-friction sealing ring is a resin ring and said compressible sealing ring is a rubber ring.

12. A component-placing apparatus for driving a suction nozzle in the rotational (θ) and vertical (Z) directions for applying suction to a component, comprising:
   a rotary actuator having a rotating shaft;
   a linear actuator comprising a stator connected to a stator of the rotary actuator such that these stators are immovable relative to each other;

a nozzle connecting shaft having the suction nozzle disposed at the bottom thereof;

the nozzle connecting shaft being connected to the rotating shaft by a coupling which allows the nozzle connecting shaft to move only rectilinearly in the longitudinal direction of the rotating shaft, relative to the rotating shaft;

a hollow holder encircling the nozzle connecting shaft with rotary bearings being interposed therebetween which allow the nozzle connecting shaft to rotate and connected for being driven by a mover of the linear actuator; and a linear guide for guiding the hollow holder relative to the stators of the actuators so as to be rectilinearly movable parallel to the rotating shaft;

wherein the mover and the stator of the linear actuator have a return spring disposed therebetween for urging the mover upwards, the return spring having a spring force which is slightly greater than the sum of the weight load of a moving part of the apparatus including the mover, the suction nozzle, and the nozzle connecting shaft, and a sliding frictional force generated at the linear guide and at said coupling.

13. The component-placing apparatus according to claim 12, wherein said linear actuator is a voice-coil motor.

14. The component-placing apparatus according to claim 12, wherein said return spring is a tension spring.

15. A component-placing apparatus for driving a suction nozzle in the rotational ($\theta$) and vertical (Z) directions for applying suction to a component, comprising:

a rotary actuator having a rotating shaft;

a linear actuator comprising a stator connected to a stator of the rotary actuator such that these stators are immovable relative to each other;

a nozzle connecting shaft having the suction nozzle disposed at the bottom thereof;

the nozzle connecting shaft being connected to the rotating shaft by a coupling which allows the nozzle connecting shaft to move only rectilinearly in the longitudinal direction of the rotating shaft, relative to the rotating shall;

a hollow holder encircling the nozzle connecting shaft with rotary bearings being interposed therebetween which allow the nozzle connecting shaft to rotate and connected for being driven by a mover of the linear actuator; and a linear guide for guiding the hollow holder relative to the stators of the actuators so as to be rectilinearly movable parallel to the rotating shaft;

wherein the hollow holder and the nozzle connecting shaft have a sealed chamber formed in a space therebetween;

the nozzle connecting shaft has an air passage formed therein for transmitting a pressure medium to the chamber from the suction nozzle;

an air port in communication with the chamber is formed in the outer surface of the hollow holder, and the air port is connectable to a vacuum suction apparatus for causing said transmission of said pressure medium.

16. The component-placing apparatus according to claim 15, wherein said sealed chamber is defined between a pair of seals disposed between said hollow holder and said nozzle connecting shaft.

17. The component-placing apparatus according to claim 16, wherein said pair of seals are both disposed between said rotary bearings.

18. The component-placing apparatus according to claim 16, further comprising a respective pair of seal stoppers arranged for holding said pair of seals in place in said hollow holder.

19. The component-placing apparatus according to claim 16, wherein each said seal comprises a low-friction sealing ring which engages said nozzle connecting shaft.

20. The component-placing apparatus according to claim 19, wherein said low-friction sealing ring is a resin ring.

21. The component-placing apparatus according to claim 19, wherein each said seal further comprises a compressible sealing ring disposed between said low-friction sealing ring and said hollow holder.

22. The component-placing apparatus according to claim 21, wherein said low-friction sealing ring is a resin ring and said compressible sealing ring is a rubber ring.

* * * * *